July 30, 1968 I. ZACHEV 3,395,359
DIFFERENTIAL AMPLIFIER
Filed Jan. 4, 1965
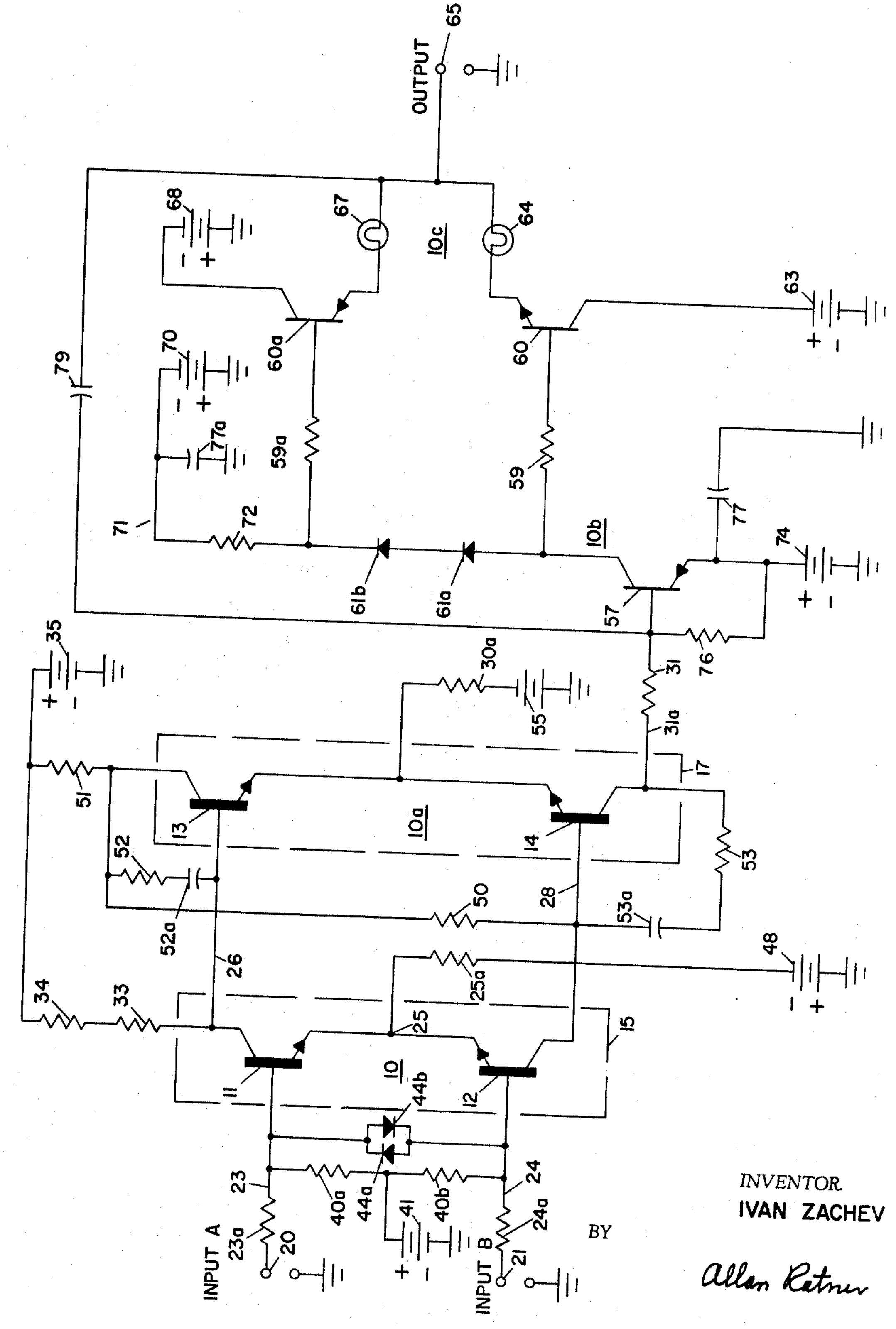
INVENTOR
IVAN ZACHEV
BY
Allan Ratner 3,395,359

DIFFERENTIAL AMPLIFIER

Ivan Zachev, Bradley Beach, N.J., assignor to Electronic Associates Inc., Long Branch, N.J., a corporation of New Jersey Filed Jan. 4, 1965, Ser. No. 423,000
4 Claims. (Cl. 330—30)

This invention relates to a differential direct-coupled amplifier and more particularly to a transistorized direct coupled amplifier in which drift has been substantially minimized.

In the design of a transistorized differential direct coupled amplifier of the unstabilized type it is necessary to take into consideration many different problems of which voltage drift is one of the most critical. As described in the literature, for example, in "Electronic Analog and Hybrid Computers" by Korn and Korn, McGraw-Hill, 1964, at page 180 et seq., transistor parameters vary with temperature and in this way cause voltage drift. Of all the transistor parameters, temperature variation of the base-to-emitter offset voltage $V_{BE}$ is the most serious source of voltage drift.

In order to attempt to minimize such voltage drift and particularly in the differential amplifier input stages where it has the most adverse effect, it has been known in the prior art to match the $V_{BE}$ of each of the transistors of the differential stages. However, such matching of transistors has not minimized the voltage drift and it has been found necessary to further utilize a variable compensating circuit. However, since the direction and magnitude of the drift has not been known, it has been necessary in each differential amplifier to specially adjust the compensating circuit throughout the entire temperature range.

Accordingly, an object of the present invention is a transistorized differential amplifier in which the transistors of the differential stages produce a predetermined magnitude and direction of voltage drift which is compensated by a fixed compensating circuit to substantially minimize voltage drift.

In carrying out the invention in one form thereof, the differential direct coupled amplifier has at least a first and second differential stage. The first differential stage has a first and a second transistor which are selected so that at a predetermined temperature the $V_{BE}$ of the second transistor has a substantially greater value than the $V_{BE}$ of the first transistor. The second differential stage has a third and a fourth transistor which are selected so that at a predetermined temperature the $V_{BE}$ of the third transistor has a substantially greater value than the $V_{BE}$ of the fourth transistor. The outputs of the first and second transistors are each connected to a different one of the inputs of the third and fourth transistors to provide at an output circuit of the second differential stage a first voltage drift produced in the first stage and amplified in the second stage and a second voltage drift produced in the second stage itself. At the output circuit the first and second voltage drifts are in the same direction and thus, a total voltage drift is produced equal to the arithmetic sum of those two drifts. In this manner there is produced a voltage drift of predetermined magnitude and direction.

A source of supply is provided for the first stage and includes a fixed temperature coefficient resistor which varies in resistance with temperature change to produce at the output circuit a voltage variation of magnitude substantially equal to and of direction opposite to said total voltage drift thereby to substantially balance out the total voltage drift. In this manner, a fixed resistor operates as a compensating circuit to substantially minimize or decrease the voltage drift with temperature change.

Further in accordance with the invention, the output circuit of the second differential stage is connected to a driver stage which amplifies the signal from that second stage and applies that signal to a pair of transistors connected in a complementary emitter-follower configuration. Diode means are connected between the input terminals of the pair of transistors and are maintained conductive for differing values of the output current to provide a substantially constant potential between the transistor input terminals. In this way the driver stage is effectively isolated from the output of the differential amplifier for the reason that the conductive diode means appears to the driver stage as a constant impedance.

For a more detailed disclosure of the invention and for further objects and advantages thereof reference is to be had to the following description taken in conjunction with the single figure of the accompanying drawing which schematically illustrates a differential direct coupled amplifier embodying the invention.

Referring to the drawing, there is shown a first input differential stage 10, a second input differential stage **10*a*, a driver stage 10*b* and an output stage 10*c*. The first differential stage 10 includes transistors 11 and 12 mounted together in an enclosure 15 which may be of the type known in the art as a "TO-5." By mounting transistors 11 and 12 of the first stage in a single enclosure or assembly, the environmental conditions of both transistors are maintained as nearly identical as possible in order to minimize any temperature difference between the transistors 11 and 12 of the first differential stage 10. In similar manner, the second differential stage 10*a* includes transistors 13 and 14, mounted for example in a TO-5 enclosure 17 thereby to maintain as identical as possible the temperature of these transistors 13 and 14**.

Transistors 11–14 may be NPN transistors of the silicon type with the $\beta$'s of transistors 11 and 12 matched by 10% and the $\beta$'s of transistors 13 and 14 may also be matched by 10%.

Differential amplifiers having a first and a second differential stage are described in detail in the above-cited Korn and Korn text at page 184 et seq. In such amplifiers a first input signal is applied to terminal 20 of an input A and a second input signal 180° out of phase with the first signal is applied to terminals 21 of an input B. The difference between the two input signals is then amplified. The first input signal applied to terminal 20 is conducted by way of a resistor 23 and a lead 23 to the base of transistor 11. In similar manner the second input signal applied to terminals 21 is conducted by way of a resistor 24 and a lead 24 to the base of transistor 12.

The collector output terminal of transistor 11 is connected by way of a conductor 26 to a base of transistor 13 and the collector output terminal of transistor 12 is connected by way of a conductor 28 to the base of transistor 14. The emitter of the pair of transistors 11 and 12 are connected together at a junction 25 and the emitters of the transistor pair 13 and 14 are connected together at a junction 30. The output of the second differential stage is taken from the collector of transistor 14 and is applied to the base of driver stage **10*b* transistor 57 by way of a conductor 31*a* and an isolating resistor 31. With the first input signal at input A being 180° out of phase with the second input signal at input B, it is understood by those skilled in the art that the output signal produced a the second differential stage 10*a*** is equal to the sum of the difference between the first and second signals.

In accordance with the invention, transistors 11–14 are selected so that at a predetermined temperature the $V_{BE}$ of transistor 12 ($V_{BE12}$) is of substantially greater value than the $V_{BE}$ of transistor 11 ($V_{BE11}$). In similar manner, at a predetermined temperature the $V_{BE}$ of transistor 13 ($V_{BE13}$) is selected to have a substantially greater value than the $V_{BE}$ of transistor 14 ($V_{BE14}$). For example, transistors 11–14 may be selected so that $V_{BE11}-V_{BE12}$ is no greater than ten millivolts and $V_{BE13}-V_{BE14}$ is no greater than thirty millivolts. In addition the $V_{BE}$'s of transistors 11–14 are each further selected to track with temperature in one direction and to have a substantially small value of $\Delta(V_{BE11}-V_{BE12})$ and $\Delta(V_{BE13}-V_{BE14})$ with change in temperature. For example, the difference between the $V_{BE}$ of transistors 11 and 12 may be selected so that for a temperature increase the resultant changes in $V_{BE}$ viz. $\Delta(V_{BE11}-V_{BE12})$, is no greater in absolute value than approximately minus 20 microvolts per degree centigrade. In similar manner the difference between the $V_{BE}$ of transistors 13 and 14 viz. $(\Delta V_{BE13}-V_{BE14})$ may be selected so that for an increase in temperature the resultant change in $V_{BE}$ is no greater in absolute value than approximately minus 20 microvolts per degree centigrade.

It will be understood that in the first stage 10 for an increase in temperature, there results a change in $V_{BE}$ in a positive direction since $V_{BE12}$ has been selected to be greater than $V_{BE11}$. In other words, as temperature increases the voltage drift appearing at conductors 26 and 28 with respect to ground is in a positive-going direction. On the other hand, since $V_{BE13}$ is greater than $V_{BE14}$ with an increase in temperature the voltage drift produced by the second stage 10*a* is in a negative direction. This negative voltage drift produced by the second stage 10*a* with increase in temperature appears at conductor 31*a* which is the output of the second stage 10*a*. The positive going drift of the first stage 10 is inverted by the second stage 10*a* and produces on conductor 31*a* a resultant negative going voltage drift. In this manner, the two voltage drifts are arithmetically added together, i.e., the negative drift produced by stage 10 and inverted by stage 10*a* and the drift produced in stage 10*a* itself, to produce a total negative voltage drift.

In order to balance or cancel the foregoing total negative drift as temperature increases, there is provided a positive temperature coefficient resistor 33 having one end connected to the collector of transistor 11. The other end of resistor 33 is connected by way of a load resistor 34 to one side of a battery 35, the other side of which is connected to ground. Thus, as temperature increases, the total collector load resistance of transistor 11 increases and the potential produced on conductor 26 decreases in a negative direction. This negative going potential is applied to the base of transistor 13 to produce at its emitter a negative going potential which results in a positive going potential being produced at the collector of transistor 14 and output conductor 31*a*. In this manner, positive temperature coefficient resistor 33 with increasing temperature produces a positive going potential at conductor 31*a* to balance out the total negative going voltage drift produced by differential stages 10 and 10*a*. Thus, resistor 33 is selected to have a value and a coefficient so that the positive going potential it produces a conductor 31*a* substantially balances out the total negative going drift. In accordance with the invention since the direction and amplitude of the voltage drift of the differential stages may be calculated, that voltage drift may be substantially balanced out by the proper selection of resistor 33.

The foregoing decrease in voltage drift is substantially lower, for example, by a factor of three, than the value of drift ordinarily produced when transistors 11–14 were selected at random. It is to be understood that this substantial decrease in the value of voltage drift occurs even when the transistor pair 11–12 of the first stage and the transistor pair 13–14 of the second stage are each matched for changes in $V_{BE}$ with temperature, in the manner well known in the art and described in the above cited Korn and Korn text at page 183 et seq.

The supply circuit for transistor 12 may be traced from the positive side of battery 35 by way of a first load resistor 51, second load resistor 50, the collector base and emitter of transistor 12, junction 25, a resistor 25*a* and to the negative side of a battery 48, the positive side of which is connected to ground. In addition, the side of resistor 51 remote from battery 35 is connected to the collector of transistor 13 and operates as that transistor's load resistor. It will be understood by the use of resistors 50 and 51 that a slightly positive feedback is applied to transistor 12 which results in overall increase in amplifier gain. The collector of transistor 13 is connected by way of a shaping network comprising a resistor 52 and a capacitor 52*a* to the base of that transistor and the collector of transistor 14 is connected by way of a shaping network comprising a resistor 53 and capacitor 53*a* to the base of that transistor. The supply circuit for transistor 13 may be traced from the positive side of battery 35 and by way of resistor 51, the collector, base and emitter of transistor 13, junction 30, a resistor 30*a* and to the negative side of a battery 55, the positive side of which is connected to ground.

The output of the second differential stage is applied by way of conductor 31*a* and isolating resistor 31 to the base of the driver stage transistor 57 which may be, for example, of the PNP type. Transistor 57 amplifies the output signal from the second differential stage and that amplified signal is applied by way of a resistor 59 to the base of a transistor 60 and by way of diodes 61*a* and 61*b* and resistor 59*a* to the base of a transistor 60*a*. The signals passed by either one of the emitter-follower transistors 60 and 60*a* which are symmetrically connected to produce an amplified exact duplicate of the input signal at the output terminal. Transistor 60 may be of the NPN type and transistor 60*a* may be of the PNP type. In order to control the A.C. gain of the driver stage 10*b* a feedback capacitor 79 is connected between an output terminal 65 and the base of driver transistor 57.

When the amplified signal appearing at the collector of transistor 57 is in a positive direction, transistor 60 is conductively biased and operates as an emitter follower to provide an output signal at output terminal 61. The output circuit of transistor 60 may be traced from a positive side of a battery 63, the collector, base, and emitter of transistor 60, non-linear resistance 64 to the output terminal 65. In this manner, positive going signals applied to the base of transistor 60 produce corresponding positive-going signals at output terminal 65 with respect to ground. When the amplified signal at the collector of transistor 57 is negative-going, transistor 60*a* is conductively biased to produce an output signal at terminal 65. The output circuit of transistor 60*a* may be traced from the negative side of a battery 68, the collector, base and emitter of transistor 60*a*, nonlinear resistance device 65 to output terminal 65. In this manner, the negative-going signals applied to the base of transistor 60*a* produce corresponding negative-going signals at the output terminal 65 with respect to ground. Non-linear resistance devices are described in detail in U.S. patent application Ser. No. 334,757, for Direct Coupled System, filed Dec. 31, 1963, and assigned to the same assignee as the present invention.

It will be understood that the negative-going signal produced at the collector of transistor 67 is applied through diodes 61*a* and 61*b*. These diodes are maintained conductive by reason of a negative bias applied to their cathodes which bias may be traced from negative terminals of a battery 70 by way of a load resistor 72 to a cathode of diode 61*b* and then through the anode thereof to the cathode of diode 61*a*. Battery 70 is of sufficient potential to conductively bias diodes 61*a* and 61*b* for all signals produced at the collector of driver transistor 57.

As previously described, diodes 61*a* and 61*b* are maintained conductive and thus the potential difference between the base of transistor 60 and the base of transistor 60*a* is maintained substantially constant for all values of input signals. Even though differing load circuits are connected between the output terminal 65 and ground to produce differing output currents the potential between the foregoing bases remains substantially constant. In contrast, in the prior art a resistance element (not shown) is used instead of diodes 61*a* and 61*b* so that the potential between bases changes for varying output currents. In addition, as a result of diodes 61*a* and 61*b* being maintained conductive, the collector of transistor 57 is effectively isolated from the output terminal since these diodes appear to that collector as a constant impedance. Thus, if a reactive load were applied to the output terminal 65 such reactance would be effectively isolated from and have substantially little effect on the collector of transistor 57.

As the input signal applied to the transistor 60 and 60*a* at the output stage 10*c* varies in polarity and as the conductivity state passes from one transistor 60 to the other transistor 60*a* and vice versa, the conductive diodes 61*a* and 61*b* are effective to reduce distortion which may result at the time of this "crossover" of the transistor conductivity states.

The remaining elements of the differential amplifier will now be described.

Input terminal 20 is connected by way of a conductor 23, a resistor 23*a*, and a biasing resistor 40*a*, to the positive side of a biasing battery 41. In similar manner input terminal 21 is connected by way of a resistor 24*a*, conductor 24 and resistor 40*b* to the positive side of a battery 41, the negative side of which is connected to ground. Resistors 40*a*, 40*b* and battery 41 are selected to have values to substantially cancel any input current produced on conductors 23 and 24. A pair of silicon diodes 44*a* and 44*b* are parallel connected to each other in opposite polarity sense between conductors 23 and 24. These diodes are utilized to provide protection for transistors 11 and 21 so that the base-to-emitter breakdown characteristics of these transistors are not exceeded. In addition, resistors 23*a* and 24*a* are selected to protect the diodes 44*a* and 44*b* by means of current limiting. A positive side of a battery 74 is connected to the emitter of transistor 57 and provides the positive potential for that emitter and also supplies collector current for transistor 14. That collector current circuit may be traced by way of a positive side of battery 74, resistor 76, resistor 31, conductor 31*a*, the collector, base and emitter of transistor 14, junction 30, resistor 30*a* and to the negative side of battery 55. The coupling capacitors 77 and 77*a* are connected respectively between the emitter of transistor 57 and ground and between the negative side of battery 70 and ground.

It is to be understood that transistors 11–14 may all be of the PNP type with corresponding reversal of the polarity of the batteries 35, 41, 58, 55 and 74. In such modification, the total voltage drift of both stages produced at conductor 31*a* would be in a positive direction, and thus the positive temperature coefficient resistor 33 would be replaced by a negative temperature coefficient resistor to balance out that total voltage drift. It will also be understood by those skilled in the art that for the stages 10 and 10*a* differing types of transistors may be utilized. These and other modifications may be made to the circuit of the present invention without departing from the spirit and scope of the invention which is to be limited only as defined in the appended claims.

What is claimed is:

1. A differential amplifier having at least a first and a second differential stage comprising, a first and a second input terminal and an output terminal, said first differential stage having a first transistor connected to said first input terminal and a second transistor connected to said second input terminal and in which the base-to-emitter offset voltage ($V_{BE}$) of said second transistor is selected to have a substantially greater value than the $V_{BE}$ of said first transistor, said second differential stage having a third and a fourth transistor in which the $V_{BE}$ of said third transistor is selected to have a substantially greater value than the $V_{BE}$ of said fourth transistor, means connecting (1) an output of said first transistor to an output of said third transistor and (2) an output of said second transistor to an input of said fourth transistor, to produce at an output circuit of said second differential stage a total voltage drift equal to the arthmetic sum of the amplified drift of said first stage and the drift of said second stage, and a single temperature coefficient resistor, said resistor varying in resistance with temperature change and being connected to said first differential stage to produce a voltage variation at said output circuit of magnitude substantially equal to and of direction opposite to said total voltage drift thereby to substantially minimize said total voltage drift.

2. The differential amplifier of claim 1 in which said output circuit has only a single output connection and there is provided an output stage having a pair of emitter-follower transistors symmetrically connected to said output terminal of said differential amplifier, a driver stage comprising a driving transistor having a base thereof connected to said single output connection of said output circuit of said second differential stage, diode means connected between input terminals of said pair of transistors and having a connection to an output of said driver means but not to said second differential stage, and means for maintaining said diode means conductive for providing a substantially constant potential between said input terminals whereby said output terminal is effectively isolated from said driver stage.

3. The differential amplifier of claim 2 in which said first, second, third, and fourth transistors are of the NPN type to produce at said output circuit a total negative-going voltage drift and in which said temperature coefficient resistor comprises a positive temperature coefficient resistor connected to the collector of said first transistor to produce at said output circuit a positive-going potential to substantially minimize said total negative-going voltage drift.

4. A differential direct coupled amplifier having at least a first and a second differential stage and an output stage having an output terminal comprising, said first differential stage having a first and a second transistor in which at a predetermined temperature the base-to-emitter offset voltage ($V_{BE}$) of said second transistor is selected to have a substantially greater value than $V_{BE}$ of said first transistor, said second differential stage having a third and a fourth transistor in which at a predetermined temperature the $V_{BE}$ of said third transistor is selected to have a substantially greater value than the $V_{BE}$ of said fourth transistor, means connecting an output of said first transistor to an input of said third transistor and connecting an output of said second transistor to an input of said fourth transistor to produce at a single output connection of said second differential stage a total voltage drift equal to the arithmetic sum of the amplified drift of said first stage and the drift of said second stage, a source of supply connected to said first transistor including a single temperature coefficient resistor for producing a voltage variation at said output circuit of said second stage of magnitude substantially equal to and of direction opposite to said total voltage drift, said output stage including a pair of emitter-follower transistors symmetrically connected to said output terminal, a driving transistor having (1) a base thereof connected to said single output connection of said output circuit and (2) a collector connected to an input terminal of one of said pair but not connected to said second differential stage, diode means connected between input terminals of said pair of transistors, and means for maintaining said diode means conductive for differing values of output currents produced at said output terminal thereby to effectively isolate said driver stage from said output terminal.

References Cited

UNITED STATES PATENTS

| | | | |
|---|---|---|---|
| 3,077,566 | 2/1963 | Vosteen | 330—14 |
| 3,188,576 | 6/1965 | Lewis | 330—23 |
| 3,328,599 | 6/1967 | Stupar | 330—30 XR |

ROY LAKE, *Primary Examiner.*

NATHAN KAUFMAN, *Assistant Examiner.*